United States Patent [19]
Vilmur et al.

[11] Patent Number: 5,107,487
[45] Date of Patent: Apr. 21, 1992

[54] POWER CONTROL OF A DIRECT SEQUENCE CDMA RADIO

[75] Inventors: Richard J. Vilmur, Palatine; Michael P. Metroka, Algonquin, both of Ill.

[73] Assignee: Motorola, Inc., Schaumburg, Ill.

[21] Appl. No.: 706,479

[22] Filed: May 28, 1991

[51] Int. Cl.⁵ .................. H04J 13/00; H04B 7/216
[52] U.S. Cl. .................................. 370/18; 455/127
[58] Field of Search ............... 370/18, 19; 455/50, 455/116, 127, 259, 69

[56] References Cited

U.S. PATENT DOCUMENTS

| | | | |
|---|---|---|---|
| 3,332,017 | 9/1967 | Dennis, Jr. | 455/116 |
| 3,390,335 | 6/1968 | Miyagi | 455/69 |
| 3,732,496 | 5/1973 | Boyer | 455/69 |
| 4,811,421 | 3/1989 | Havel et al. | 455/69 |
| 5,003,619 | 3/1991 | Morris et al. | 455/69 |

Primary Examiner—Douglas W. Olms
Assistant Examiner—R. Blum
Attorney, Agent, or Firm—Kenneth W. Bolvin

[57] ABSTRACT

The power control apparatus of the present invention is comprised of a local oscillator signal path coupled to a mixer (106) through a variable attenuator (107) and an IF signal path coupled to the mixer (106) through two variable attenuators (108 and 109) coupled in series. The IF signal path attenuators (108 and 109) are controlled by digital control circuitry (111) while the local oscillator path attenuator (107) is controlled by the control circuitry through a level shifter (110). The power level of the signal generated by the mixing of these two signals is less than the conducted output of the radiotelephone's power amplifier.

11 Claims, 2 Drawing Sheets

POWER CONTROL OF A DIRECT SEQUENCE CDMA RADIO

FIELD OF THE INVENTION

The present invention relates generally to the field of communications and particularly to code-division multiple access (CDMA) transmitter power control.

BACKGROUND OF THE INVENTION

Direct-sequence CDMA (DS-CDMA) type radiotelephones require some form of power management scheme to control the output power level of the end user's radiotelephone's transmitter to control system interference at the input of the base site receiver. DS-CDMA is explained in detail in John G. Proakis, Digital Communications, 2nd Edition, pages 800-845. This power management, performed by the combination of the base station receiver, base station transmitter, and user radiotelephone (mobile), prevents a transmitting radiotelephone from using more of the system capacity than is needed for adequate communication from the mobile to the base station.

This power control is performed by two power control loops, an open loop for the initial estimate and a closed power control loop to correct this initial estimate. The radiotelephone, in performing the open loop control, uses the received signal strength indicator (RSSI) to estimate the signal path power loss from the base to the radiotelephone. The radiotelephone can then compensate the amount of power loss when transmitting back to the base station. Since the loss from the base station to the radiotelephone is not the same as the radiotelephone to the base station due to generally different and widely separated transmit and receive frequencies, this is just an initial estimate that must be corrected.

The correction, which modifies the original estimate, is accomplished by the base station transmitting power control bits to the mobile radiotelephone at typical rates of 800 to 1000 times per second. A power bit of 1 instructs the radiotelephone to increase power by one power step and a 0 instructs the radiotelephone to decrease power by one power step or vice versa depending on an agreed upon system protocol. One power step is a set value typically in the range of 0.5 to 1.5 dB. The closed loop control has a typical control range of ±24 dB. The total power control range is typically 80 dB for a 1 watt maximum power mobile.

A DS-CDMA radiotelephone's power amplifier must be at least class AB linear since the modulation for the system may be partly amplitude modulated for all modulation types and also to control transmitter splatter after the modulation bandwidth has been set by filters before the power amplifier. As is already known by one skilled in the art, the output of linear power amplifiers have to be controlled by some form of in-line attenuation and not by controlling the power supply voltage. This causes a problem in systems, such as the DS-CDMA radiotelephone system, where the power control required has a large range. This wide power control range can result in spurious radiation out of the circuits at a higher level than the desired conducted radiation, thus interfering with the desired level of the transmitted signals. This type of radiation is also difficult to shield adequately to keep it from interfering with other circuits in the radiotelephone. Additionally, there is a problem with conducted leakage around variable attenuator circuits that control the RF output level. There is a resulting need for a circuit that accomplishes the variable attenuator function without causing the spurious radiation or leakage problems.

SUMMARY OF THE INVENTION

The power control apparatus of the present invention is comprised of a local oscillator signal path coupled to a mixer through a variable attenuator and an IF signal path coupled to the mixer through two variable attenuators coupled in series. The attenuators are controlled by digital control circuitry. The mixer generates a transmit frequency signal from the mixing of the attenuated IF signal and the attenuated local oscillator signal.

DETAILED DESCRIPTION OF THE PREFERRED EMBODIMENT

The radiotelephone power control apparatus of the present invention permits attenuation of DS-CDMA signals before transmission without spurious or conducted radiation problems. This is accomplished by distributing the attenuation to both inputs of the mixer that generates the transmit frequency signal and keeping the power level of this signal below the level of the transmitted signal.

Figure 1:
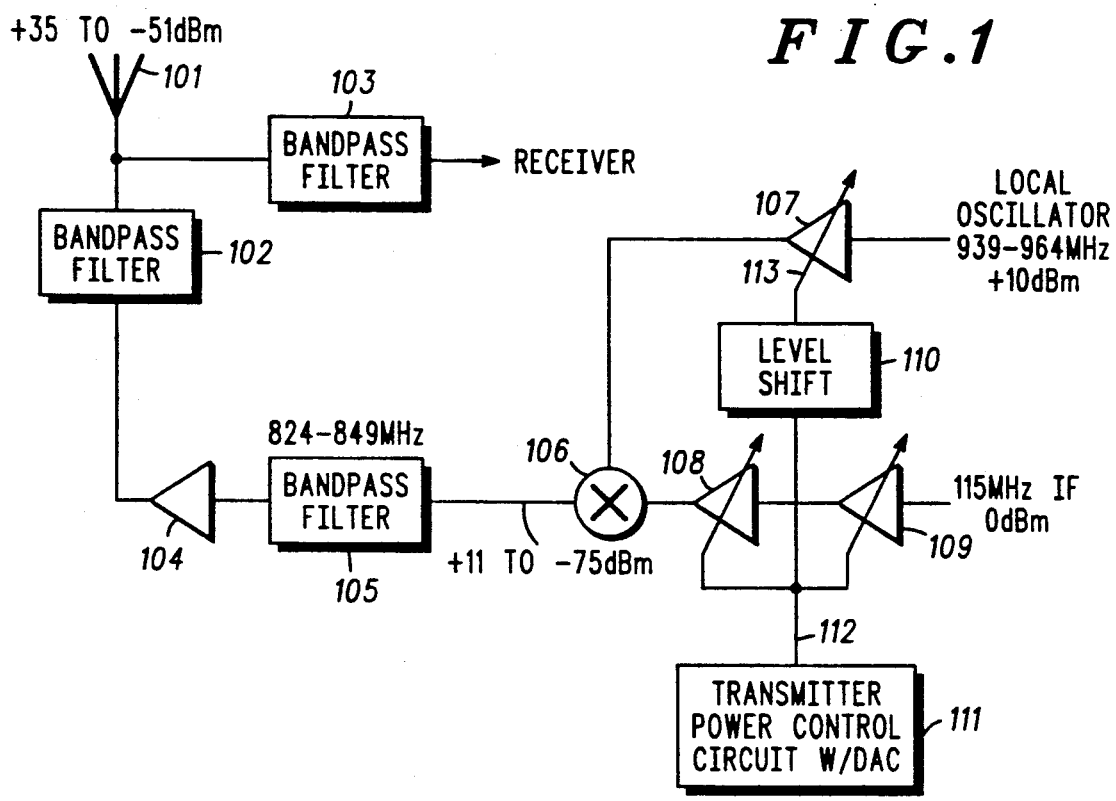
FIG. 1 shows the power control apparatus of the present invention with the receiver front end and transmitter back end.

The power control apparatus of the present invention is illustrated in FIG. 1. The power control portion of FIG. 1 includes elements (106) through (113). The antenna (101) is used to receive and transmit DS-CDMA signals with the range of +35 to −51 dBm being a typical transmit power control range. The bandpass filters (102 and 103) are connected in duplex fashion to the transmitter output and the receiver input respectively. The power amplifier (104) is at least a class AB linear power amplifier capable of providing the necessary maximum power and gain of the signals from the power control apparatus which are filtered to the final transmitter frequency range by the bandpass filter (105).

The power control apparatus is comprised of dual paths to the mixer (106); one path for the local oscillator signal and the other for the IF signal from the modulator section of the typical DS-CDMA transmitter. Both paths of the power control apparatus have variable attenuators that are controlled by a transmitter power control circuit (111) having a digital-to-analog (D/A) converter and low pass filtering. Variable attenuators (108) and (109) are connected in series between the IF signal and the mixer (106). They are controlled by the attenuator control signal (112) from the transmitter power control circuit (111). A variable attenuator (107) is in series with the local oscillator signal and the second input to the mixer. This attenuator, in the preferred embodiment, is controlled by a signal derived from the attenuator control signal (112) that is level shifted and delayed by a level shift circuit (110). The preferred embodiment of the power control apparatus is implemented as an integrated circuit of the dielectrically isolated monolithic microwave integrated circuit (DIMMIC) or another high speed bipolar or bipolar-complementary metal oxide semiconductor (BICMOS) process. All of these types of integrated circuits, because they are very small, contribute little to spurious emissions that would interfere with the desired range of power control.

It is also necessary to control signal leakage from the IF lead of the IC to the local oscillator lead of the IC. If the entire range of power control were to be accomplished without the variable attenuator (107), the isolation between the two signal input leads would have to be greater than the desired power control range. This problem is eliminated by the variable attenuator (107) that reduces the dynamic range of the attenuation needed in the IF branch, thus reducing the necessary lead isolation. At the mid or lower end of the dynamic range of the desired mixer output there is no problem in reducing the level of the local oscillator signal. This has the effect of desensitizing the mixer and reducing its gain. At high desired output signal levels, level shift circuit (110) is arranged so that changes in the attenuator control signal (112) have no effect on the variable attenuator (107). The variable attenuator (107) is controlled by a signal (113) that is produced by the level shift circuit (110).

In the preferred embodiment of the present invention, the local oscillator signal operates in the range of 939-964 MHz and the IF signal is (115) MHz. The mixer (106) generates a transmit frequency signal in the range of 824-849 MHz at a power range of +11 to −75 dBm. This signal is bandpass filtered (105) before the power amplifier (104). The power amplifier (104) increases the power level to +38 to −48 dBm. This signal is then bandpass filtered (102) again before transmission from the antenna at a power level range of +35 to −51 dBm. It can be seen from these typical power levels that the transmitter frequency is first generated at a level below the desired antenna output level. This is done by performing the needed variable attenuation by the combination of variable attenuators in the IF and the local oscillator branches of the mixer (106). This guarantees that spurious radiation of the transmit frequency will be below the desired and controlled conducted antenna output.

Figure 2:
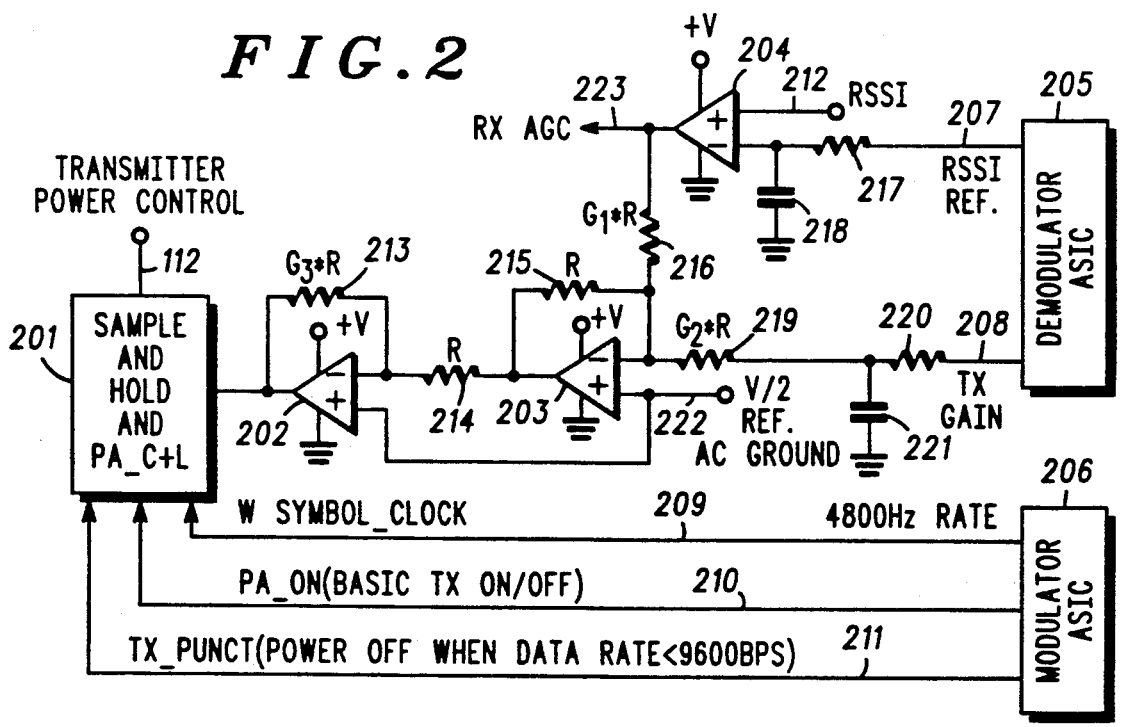
FIG. 2 shows a typical transmit power control circuit in accordance with the present invention.

The anttenuator control signal (112) for the power control apparatus of the present invention can be performed by a transmit power control circuit such as is illustrated in FIG. 2. The input control signals from which the attenuator control signal (112) is derived are RSSI (212), RSSI Reference (207), and Tx Gain (208). RSSI (212), an analog signal, is the received signal strength indicator that is generated by the wideband IF of the DS-CDMA receiver. RSSI Reference (207) is used to compare with the RSSI (212) to generate a Rx AGC signal as the output of operational amplifier (204). Tx Gain (208) is the cumulative sum of the closed loop power control bits that have been received from the communicating base site. Both RSSI Reference (207) and Tx Gain (208) are digital signals that, in the preferred embodiment, are high frequency pulse-width-modulated PWM signals. These signals can be generated in a Demodulator ASIC (205) as shown in FIG. 2 or from a microprocessor or DSP as multi-bit signals and then put through D/A converters. The PWM signals can easily be converted to analog signals by low pass filtering. The low pass filter for the RSSI Reference (207) signal is comprised of resistor (217) and capacitor (218). The low pass filter for the Tx Gain signal is comprised of resistor (220) and capacitor (221). In the preferred embodiment, the 3 dB corner of these low pass filters is 5000 Hz.

The Rx AGC (223) signal, which is the open loop power control signal, and the low pass filtered Tx Gain (208) signal, which is the closed loop power control signal, are combined in an inverting operational amplifier (203) having an AC grounded reference voltage on its plus lead that is half the DC supply voltage. The relative contributions of the open and closed loop signals are controlled by resistors (216) and (219) respectively. These resistors are selected relative to the feedback resistor (215) and are labeled $G_1*R$ (216) and $G_2*R$ (219). Proper selection of these resistors for a particular DS-CDMA system provides the appropriate balance between the open loop control signal and the closed loop control signal at the output of the operation amplifier (203). The output of the operational amplifier (203) is fed through a resistor (214) to the inverting input of another operational amplifier (202). A resistor (213) provides the final gain adjustment of the transmitter power control signal and in most cases will provide for a gain factor of one. The output of operational amplifier (202) now has the same sense as the Rx AGC (223) signals and the low pass filtered Tx Gain (208) signals since amplifiers (202) and (203) perform a double inversion. If the attenuators (107), (108), and (109) of the power control apparatus require an opposite sense transmit power control signal, the inverting operational amplifier (202) and associated resistors (213 and 214) can be removed.

In the preferred embodiment, the output of operational amplifier (202) is passed through a sample and hold circuit (201) that also contains power amplifier control circuitry. In the preferred embodiment, there are three digital control signal inputs to the sample and hold circuit (201) that are provided by the Tx Modulator ASIC 206. W_Symbol_Clock (209) is a pulsed signal at a 4800 Hz rate that enables the transfer of the output of operational amplifier (202) to the output of the sample and hold circuit (201). PA_On (210) is the overall power amplifier on/off control signal. If PA_On (210) is in its off state, the attenuator control signal (112) is held to the level that produces a maximum attenuation that is normally about 20 dB more than the low end of the normal dynamic power control range. Tx_Punct (211) is a signal that can be used to gate the transmitter output when the DS-CDMA system is operating at less than its normal full data rate. The gating pulse can be as short as 1 millisecond in duration and may have repetition rates of several hundred Hz. An alternate way to accomplish a variable data rate power control in a DS-CDMA system is to just drop the Tx power level proportionately to the reduction in data rate. This reduction in power, however, adds to the dynamic power control range of the system. Use of the Tx_Punct (211) signal to gate the transmitter at the normal full data rate power level accomplishes the same end result without increasing the dynamic range of the power control system.

Figure 3:
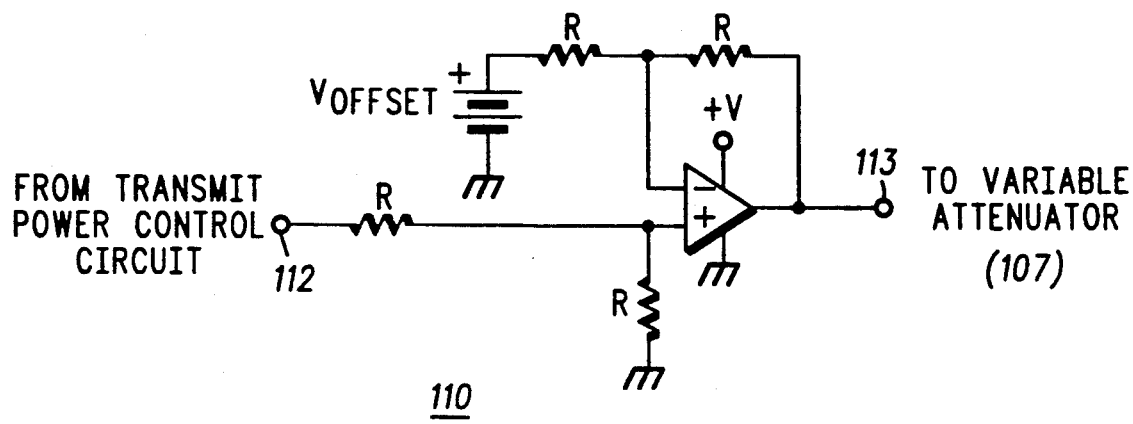
FIG. 3 shows a schematic diagram of the level shift block.
Figure 4:
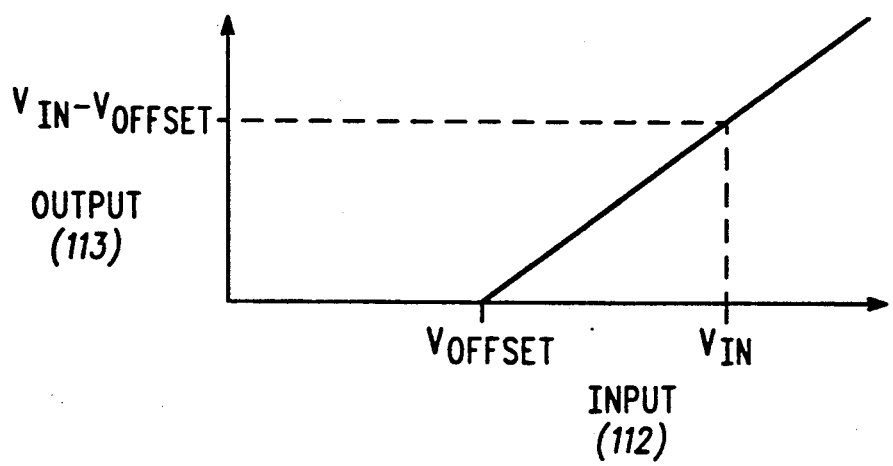
FIG. 4 shows the transfer function of the level shift block.

A circuit that can be used for the level shift function (110) is illustrated in FIG. 3. This circuit is comprised of an operational amplifier and accompanying resistors. In the preferred embodiment, the resistors have the same resistance. FIG. 4 illustrates the transfer function of the level shift circuit. It can be seen that the output signal (113) is the input signal (112) reduced by $V_{offset}$. This shift causes the local oscillator signal attenuator (107) to delay attenuation with respect to the attenuation by the IF signal attenuators (108 and 109). It can be seen from FIG. 4 that the signal (113) produced by the level shift circuit (110) will lag behind the attenuator control signal (112) by $V_{offset}$. Thus, the attenuator (107) in the local oscillator path will not attenuate until the attenuation control signal input (112) goes beyond $V_{offset}$. It is also know in the art that the operational amplifier of the level shift circuit has an inherent gate delay that will delay the attenuation control signal input (112) in relation to the output (113) of the level shift circuit—after the last sentence of the paragraph.

In summary, a power control apparatus for a DS-CDMA radiotelephone has been shown. This apparatus controls the transmitter power over a wide dynamic range while avoiding the production of spurious and uncontrolled transmit power.

We claim:

1. An apparatus for controlling transmitted power of a code-division multiple access communication device, the communication device having a local oscillating signal, an intermediate frequency (IF) signal, the apparatus comprising:

means for generating an attenuation control signal;

first controllable attenuation means, coupled to the local oscillating signal, for generating an attenuated local oscillating signal, the first controllable attenuation means changing attenuation in response to the attenuation control signal;

second controllable attenuation means, coupled to the IF signal, for generating an attenuated IF signal, the second attenuation means changing attenuation in response to the attenuation control signal; and mixing means, coupled to the first controllable attenuation means and the second controllable attenuation means, for generating a transmit frequency signal from the attenuated local oscillating signal and the attenuated IF signal.

2. The apparatus of claim 1 and further including third controllable attenuation means coupled in series with the second controllable attenuation means and the mixing means, the third controllable attenuation means changing attenuation in response to the attenuation control signal.

3. The apparatus of claim 1 and further including filtering means coupled to the mixing means for generating a filtered transmit frequency signal.

4. The apparatus of claim 3 and further including power amplification means for amplifying the filtered transmit frequency signal.

5. The apparatus of claim 1 wherein the means for generating an attenuation control signal is coupled to the first controllable attenuation means by level shifting means.

6. The apparatus of claim 5 wherein the level shifting means delays the attenuation control signal from controlling the attenuation of the first controllable attenuation means.

7. An apparatus for controlling transmitted power of a code-division multiple access communication device, the communication device having a local oscillating signal, an intermediate frequency (IF) signal, the apparatus comprising:

means for generating an attenuation control signal;

first controllable attenuation means, coupled to the local oscillating signal, for generating an attenuated local oscillating signal, the first controllable attenuation means changing attenuation in response to the attenuation control signal;

second controllable attenuation means, coupled to the IF signal, for generating a first attenuated IF signal, the second attenuation means changing attenuation in response to the attenuation control signal;

third controllable attenuation means, coupled to the second controllable attenuation means, for generating a second attenuated IF signal from the first attenuated IF signal, the third attenuation means changing attenuation in response to the attenuation control signal;

mixing means, coupled to the first controllable attenuation means and the third controllable attenuation means, for generating a transmit frequency signal from the attenuated local oscillating signal and the second attenuated IF signal, the transmit frequency signal having a first power level;

filtering means, coupled to the mixing means, for generating a filtered transmit frequency signal; and amplification means for amplifying the filtered transmit frequency signal, thus generating a signal for transmission having a second power level larger than the first power level.

8. The apparatus of claim 7 wherein the means for generating an attenuation control signal is coupled to the first controllable attenuation means by level shifting means.

9. The apparatus of claim 8 wherein the level shifting means delays the attenuation control signal from controlling the attenuation of the first controllable attenuation means.

10. An apparatus for controlling transmitted power of a code-division multiple access communication device, the communication device having a local oscillating signal, an intermediate frequency (IF) signal, the apparatus comprising:

means for generating an attenuation control signal;

level shifting means for generating a level shifted and delayed attenuation control signal;

first controllable attenuation means, coupled to the local oscillating signal, for generating an attenuated local oscillating signal, the first controllable attenuation means changing attenuation in response to the level shifted and delayed attenuation control signal;

second controllable attenuation means, coupled to the IF signal, for generating a first attenuated IF signal, the second attenuation means changing attenuation in response to the attenuation control signal;

third controllable attenuation means, coupled to the second controllable attenuation means, for generating a second attenuated IF signal from the first attenuated IF signal, the third attenuation means changing attenuation in response to the attenuation control signal;

mixing means, coupled to the first controllable attenuation means and the third controllable attenuation means, for generating a transmit frequency signal from the attenuated local oscillating signal and the second attenuated IF signal, the transmit frequency signal having a first power level;

filtering means, coupled to the mixing means, for generating a filtered transmit frequency signal; and amplification means for amplifying the filtered transmit frequency signal, thus generating a signal for transmission having a second power level larger than the first power level.

11. A code-division multiple access communication device having the ability to transmit and receive signals, the device comprising:

oscillating means for generating a local oscillating signal;

modulation means for generating an intermediate frequency (IF) signal; and means for controlling transmitted power comprising:
means for generating an attenuation control signal;
first controllable attenuation means, coupled to the local oscillating signal, for generating an attenuated local oscillating signal, the first controllable attenuation means changing attenuation in response to the attenuation control signal;
second controllable attenuation means, coupled to the IF signal, for generating an attenuated IF signal, the second attenuation means changing attenuation in response to the attenuation control signal; and
mixing means, coupled to the frist controllable attenuation means and the second controllable attenuation means, for generating a transmit frequency signal from the attenuated local oscillating signal and the attenuated IF signal.

* * * * *